US007339109B2

(12) United States Patent
Stan et al.

(10) Patent No.: US 7,339,109 B2
(45) Date of Patent: Mar. 4, 2008

(54) APPARATUS AND METHOD FOR OPTIMIZING THE EFFICIENCY OF GERMANIUM JUNCTIONS IN MULTI-JUNCTION SOLAR CELLS

(75) Inventors: Mark A. Stan, Albuquerque, NM (US); Nein Y. Li, Sunnyvale, CA (US); Frank A. Spadafora, Baden, PA (US); Hong Q. Hou, Albuquerque, NM (US); Paul R. Sharps, Albuquerque, NM (US); Navid S. Fatemi, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 09/885,319

(22) Filed: Jun. 19, 2001

(65) Prior Publication Data

US 2002/0040727 A1 Apr. 11, 2002

Related U.S. Application Data

(60) Provisional application No. 60/212,552, filed on Jun. 20, 2000.

(51) Int. Cl.
*H01L 31/0216* (2006.01)
*H01L 31/0256* (2006.01)

(52) U.S. Cl. ...................................... 136/256; 136/262

(58) Field of Classification Search ................ 136/249, 136/255, 261, 262, 252; 438/74, 57, 510, 438/542, 545, 546, 558; 257/431, 461, 464
See application file for complete search history.

(56) References Cited

U.S. PATENT DOCUMENTS 4,001,864 A * 1/1977 Gibbons ..................... 136/255
4,322,571 A * 3/1982 Stanbery ..................... 136/255
4,634,605 A * 1/1987 Wiesmann ............... 427/249.5
5,342,453 A * 8/1994 Olson ......................... 136/262
5,571,339 A * 11/1996 Ringel et al. ............... 136/252
6,380,601 B1 * 4/2002 Ermer et al. ................ 257/440

OTHER PUBLICATIONS

Friedman et al, "Back Surface Fields for GalnP2 Solar Cells," IEEE, (1991), pp. 358-360.*

(Continued)

*Primary Examiner*—Nam Nguyen
*Assistant Examiner*—Jeffrey Barton

(57) ABSTRACT

Apparatus and Method for Optimizing the Efficiency of Germanium Junctions in Multi-Junction Solar Cells. In a preferred embodiment, an indium gallium phosphide (InGaP) nucleation layer is disposed between the germanium (Ge) substrate and the overlying dual-junction epilayers for controlling the diffusion depth of the n-doping in the germanium junction. Specifically, by acting as a diffusion barrier to arsenic (As) contained in the overlying epilayers and as a source of n-type dopant for forming the germanium junction, the nucleation layer enables the growth time and temperature in the epilayer device process to be minimized without compromising the integrity of the dual-junction epilayer structure. This in turn allows the arsenic diffusion into the germanium substrate to be optimally controlled by varying the thickness of the nucleation layer. An active germanium junction formed in accordance with the present invention has a typical diffused junction depth that is ⅕ to ½ of that achievable in prior art devices. Furthermore, triple-junction solar cells incorporating a shallow n-p germanium junction of the present invention can attain 1 sun AM0 efficiencies in excess of 26%.

31 Claims, 5 Drawing Sheets n+/p $InGaP_2$ Top Cell
p++/n++ Tunnel Junction
n+/p GaAs Middle Cell
p++/n++ Tunnel Junction
n+ GaAs Buffer
n+ InGaP Nucleation Layer
Shallow n+/p Ge Diffused Junction Dual Junction Cell Bottom Germanium (Ge) Cell

OTHER PUBLICATIONS

Chiang et al, Experimental Results of GalnP2/GaAs/Ge Triple Junction Cell Development for Space Power Systems, 25th IEEE PVSC, May 13-17, 1996, pp. 183-186.*

Yamaguchi, "Compound Semiconductor Solar Cells, Present Status", Dec. 1990 NTT Opto-electronics Labs., vol. 5, pp. 143-155.

Chiang, et al., "Large Area GalnP2/GaAs/Ge Mutijunction Solar Cells For Space Applications", May 1994, pp. 2120-2123.

Sharps, "Growth and Development of GalnAsP for Use in High-Efficiency Solar Cells", Oct. 1994, NREL, pp. 1-27.

* cited by examiner

APPARATUS AND METHOD FOR OPTIMIZING THE EFFICIENCY OF GERMANIUM JUNCTIONS IN MULTI-JUNCTION SOLAR CELLS

PRIORITY

Pursuant to 35 U.S.C. §119(e) and 37 C.F.R. §1.78, the present application claims priority to the provisional application entitled "An Apparatus and Method for Optimizing the Efficiency of Germanium Junctions in Multi-Junction Solar Cells" by Mark A. Stan et al. (application No. 60/212,552) filed on Jun. 20, 2000.

GOVERNMENT RIGHTS NOTICE

Portions of the material in this specification arose as a result of Government support under contracts between Emcore Corporation and the U.S. Government Agency. Accordingly, the U.S. Government has certain rights in this invention.

FIELD OF THE INVENTION

The present invention relates to solar cells and methods for their fabrication, and more particularly to optimizing the efficiency of germanium (Ge) junctions of multi-junction solar cells having a stacked semiconductor layer structure to provide a high efficiency for the conversion of incident light into electrical energy.

DESCRIPTION OF THE RELATED ART

Solar cells are one of the most important new energy sources that have become available in the past several years. Considerable effort has gone into solar cell development. Most of the work has involved using silicon-based semiconductor materials. As a result, solar cells are currently being used in a number of commercial and consumer-oriented applications. While significant progress has been made in this area, the requirement for solar cells to meet the needs of more sophisticated applications has not kept pace with demand. Applications such as satellites used in mobile and telephone communications have dramatically increased the demand for solar cells with improved power and energy conversion characteristics.

In satellite and other space related applications, the size, mass, and cost of a satellite power system is dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, becomes increasingly more important.

The energy conversion characteristic of a solar cell is dependent on the effective utilization of the available solar spectrum. Currently, a state-of-the-art solar cell is a multi-junction device that uses layers of indium gallium phosphide (InGaP), gallium arsenide (GaAs), and germanium (Ge). This triple-junction structure is based on an older dual-junction solar cell structure made of indium gallium phosphide (InGaP) and gallium arsenide (GaAs) covering the absorption spectrum from UV to 890 nm. The addition of a germanium (Ge) junction to the dual-junction structure extends the absorption edge to 1800 nm. Since the germanium (Ge) junction causes increased access to the solar spectrum, the current generated in the germanium (Ge) junction is usually very high. The germanium (Ge) junction is not likely to limit the overall current of this serially connected multi-junction structure. Thus, the contribution of a germanium (Ge) junction improves the energy conversion efficiency by adding open-circuit voltage. Therefore, it becomes extremely important to optimize the open-circuit voltage of the germanium (Ge) junction without sacrificing the overall performance of the solar cell.

FIG. 1 is a diagram that depicts the formation of a typical diffused germanium (Ge) junction on a p-type substrate. As FIG. 1 illustrates, the junction is formed by the diffusion of arsenic (As) and/or phosphorus (P) into the germanium (Ge) so that the conduction element of p-type substrate is converted into n-type. Arsenic is an n-type impurity in germanium with a solubility, at metal organic chemical vapor deposition (MOCVD) growth temperatures, of $8\times10^{19}$ cm$^{-3}$. In the prior art an electro-optically active germanium junction is formed as a consequence of arsenic diffusion into the p-type germanium substrate during the growth of arsenic-containing overlying epilayers.

A critical factor in maximizing the open circuit voltage characteristic is the control of the depth of the germanium (Ge) junction. As a consequence of the solid state diffusion process, the n-type germanium emitter is highly doped. As a result, most of the photogenerated carriers in this region will recombine before collecting at the n-p junction. This leads to an increased reverse saturation current (or referred to as "dark current") and in a concomitant reduction in the open circuit voltage ($V_{oc}$) of the cell. Additionally, one would like to minimize the junction depth because the highly doped emitter region acts as an absorber of the incident long wavelength solar radiation. The increased absorption of long wavelength radiation causes lower short circuit current ($J_{sc}$) in the cell, which in turn, reduces the open circuit current of the stack. This results in less than optimum performance.

The depth of the diffused germanium junction is a function of the thermal load that results from the time-temperature profile of the epilayers grown on top of the p-type germanium substrate. Optimization of the germanium junction cannot be accomplished without affecting the subsequent dual junction epilayer device process. More specifically, to control the arsenic diffusion of the germanium substrate, the growth time and temperature of the overlying dual junction epilayer structure must be minimized. Thus, the integrity of the dual junction epilayer structure may be compromised to obtain an appropriate arsenic diffusion profile on the germanium substrate.

SUMMARY OF THE INVENTION

A preferred embodiment of the present invention provides a method for optimizing the open-circuit voltage of the germanium (Ge) junction in the multi-junction solar cell structure.

In accordance with the purpose of the invention, as embodied and broadly described herein, the invention relates to an alternative and more effective way of controlling the diffusion resulting in the formation of the active germanium junction. Diffused junction depths ⅕-½ of that obtained in the prior art are typical for the invention described below. A shallow n-p germanium junction of the present invention allows for the manufacture of monolithic triple junction solar cells with 1sun AM0 efficiencies in excess of 26%.

Advantages of the invention will be set forth, in part, in the description that follows and, in part, will be understood by those skilled in the art from the description herein.

BRIEF DESCRIPTION OF THE DRAWINGS

The accompanying drawings, which are incorporated in and constitute a part of this specification, illustrate several embodiments of the invention and, together with the description, serves to explain the principles of the invention.

DETAILED DESCRIPTION OF A PREFERRED EMBODIMENT

The present invention now will be described more fully with reference to the accompanying drawings, in which the preferred embodiments of the invention are shown. The present invention may, however, be embodied in many different forms and should not be construed as being limited to the embodiments set forth herein; rather these embodiments are provided so that this disclosure will be thorough and complete and will fully convey the invention to those skilled in the art.

Figure 1:
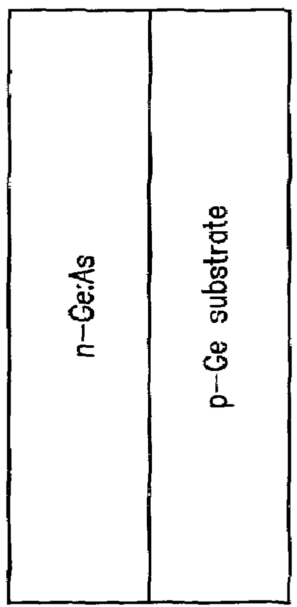
FIG. 1 is a diagram that depicts the formation of the diffused germanium (Ge) junction on a p-type substrate.
Figure 2:
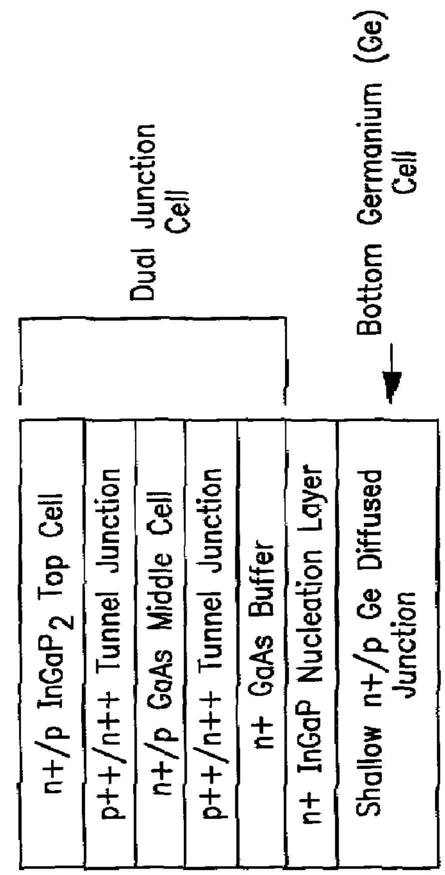
FIG. 2 is a block diagram that shows a schematic cross section of a triple junction solar cell in which an embodiment of the present invention has been implemented.

FIG. 2 is a block diagram that shows a schematic cross section of a triple junction solar cell in which an embodiment of the present invention has been implemented. In the present invention a phosphorus containing compound, InGaP, with a lattice parameter equal to that of the germanium substrate is inserted as a nucleation layer between the germanium substrate and the overlying dual junction epilayers as shown in FIG. 2. The indium gallium phosphide (InGaP) nucleation layer serves as a diffusion barrier to arsenic contained in the overlying dual junction layers. Additionally, the nucleation layer serves as a source of n-type dopant used to form the shallow diffused germanium junction. Phosphorus is an n-type impurity with a solubility of $2\times10^{20}$ $cm^{-3}$ at metal organic chemical vapor deposition (MOCVD) growth temperatures.

Data indicates that for the range of temperatures used in the metal organic chemical vapor deposition (MOCVD) growth of solar cell epilayers structures, the diffusion coefficient of phosphorus into a germanium substrate is approximately ⅓ that of arsenic diffusion coefficient into germanium. Therefore, given an equal surface concentration and diffusion time, the phosphorus impurity would diffuse into the germanium to a depth of $(1/3)^{1/2}$ relative to that of arsenic in germanium. However, arsenic (As) and phosphorus (P) are not present in equal surface concentrations at the same temperatures. Solid state diffusion proceeds typically via vacancy and interstitial formation, which are thermally activated processes. In the case of indium gallium phosphorus (InGaP), this requires the breaking of either the indium phosphorus (In-P) or gallium phosphorus (Ga-P) bonds whereas in gallium arsenic (GaAs) it requires the breaking of the gallium arsenic bond (Ga-As). Available data indicates that the gallium phosphorus (Ga-P) and indium phosphorus (In-P) bonds are stronger than the gallium arsenic bond (Ga-As). As such, the population of phosphorus (P) vacancies in indium gallium phosphorus (InGaP) is lower than that of the arsenic (As) vacancies in gallium arsenic (GaAs) at the same temperature. Consequently, the concentration of arsenic present at the gallium arsenic germanium interface (GaAs-Ge) is higher than that of phosphorus at the indium gallium phosphide germanium interface (InGaP-Ge).

Figure 3:
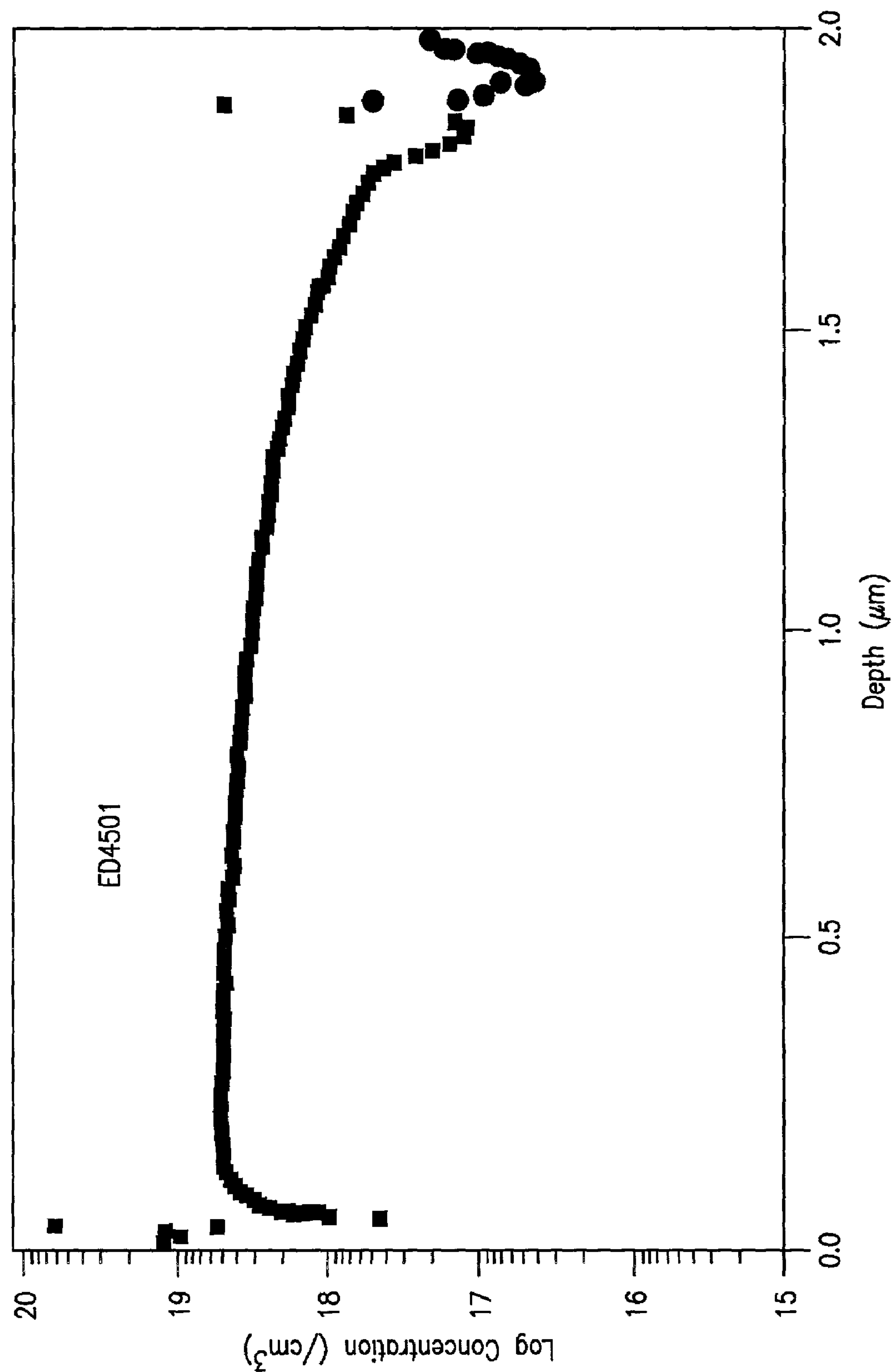
FIG. 3 shows an electrochemical etch profile of a diffused germanium junction of a typical dual junction with a gallium arsenide (GaAs) nucleation layer next to the p-Ge substrate.

FIG. 3 shows an electrochemical etch profile of a diffused germanium junction in a typical dual junction device with a gallium arsenide (GaAs) nucleation layer next to the p-Ge substrate. The junction depth in this case is approximately 1.8 μm.

Figure 4:
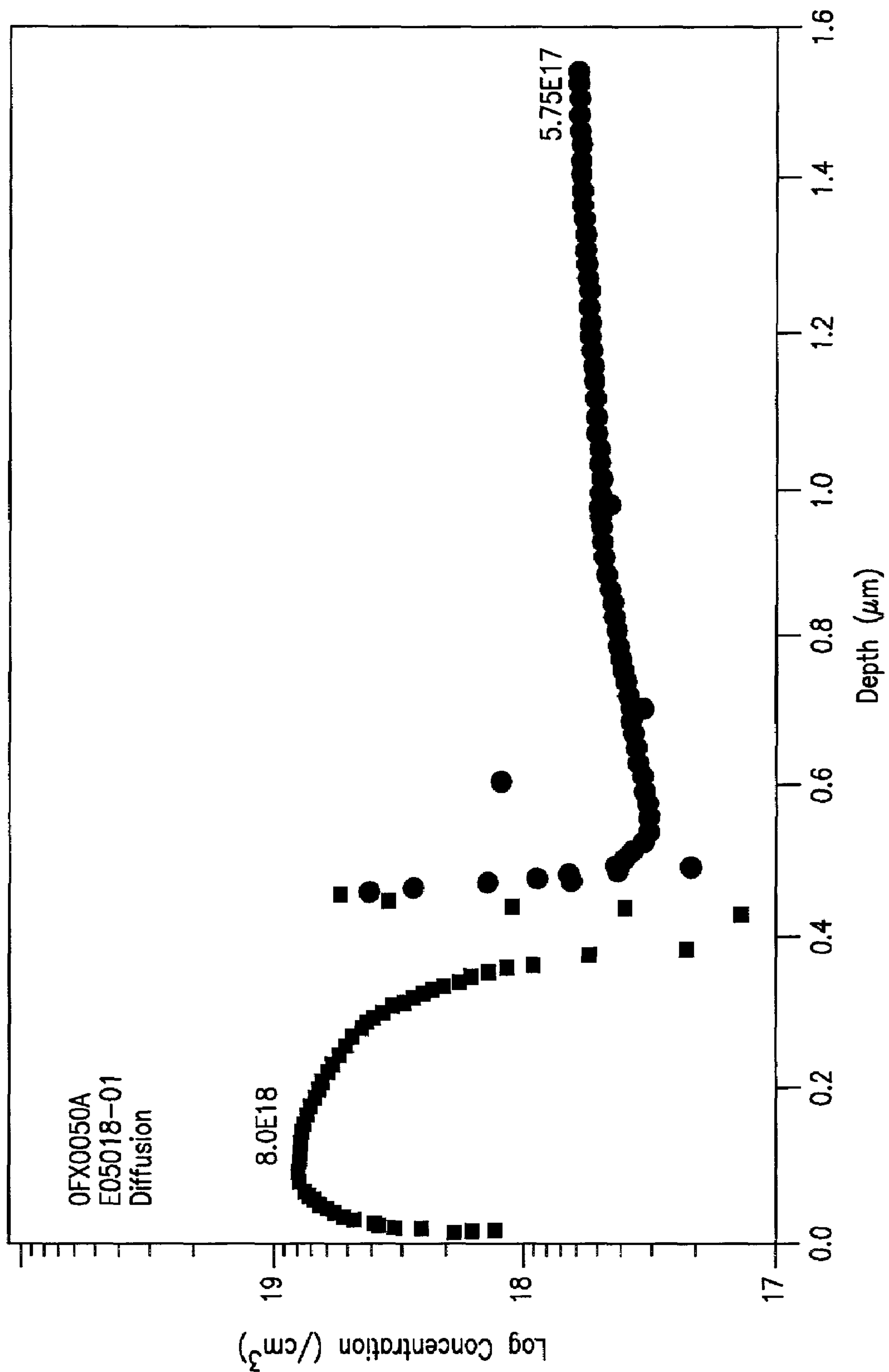
FIG. 4 shows an electrochemical etch profile of a diffused germanium junction with an indium gallium phosphide (InGaP) nucleation layer between the gallium arsenide (GaAs) and the p-Ge substrate that embodies the present invention.

FIG. 4 shows an electrochemical etch profile of a sample with a 350 Å indium gallium phosphide (InGaP) nucleation layer between the gallium arsenide (GaAs) and the p-Ge substrate that embodies the present invention. Here, the germanium (Ge) junction depth is 0.4 μm. As such the germanium (Ge) junction depth has been reduced by more than a factor of 4.

Figure 5:
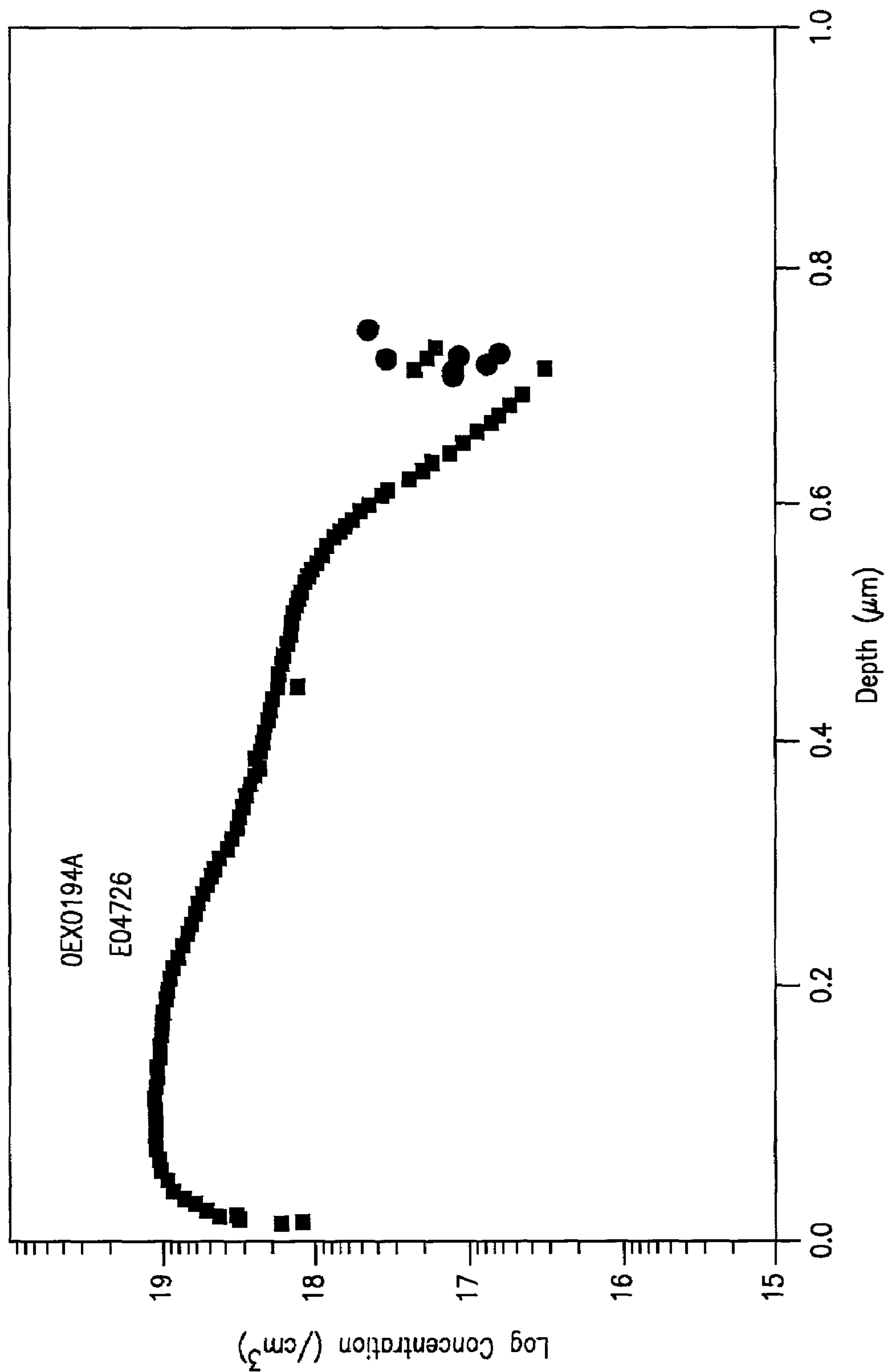
FIG. 5 is an electrochemical etch profile of a diffused germanium junction utilizing a thinner indium gallium phosphide (InGaP) nucleation layer in yet another embodiment of the present invention.

Reference is now made to FIG. 5 showing an electrochemical etch profile of the effect of utilizing a thinner indium gallium phosphide (InGaP) nucleation layer between the gallium arsenide (GaAs) and the p-Ge substrate. The profile in FIG. 5 shows a two-step profile with a junction depth of 0.7 μm. The near surface concentration is due to the presence of phosphorus (P) whereas the region between 0.3 μm and 0.7 μm is due to the presence of arsenic (As). A two-step diffusion profile such as that in FIG. 5 may serve as a built-in field to help carrier collection in the emitter layer. The data in FIGS. 3 through 5 clearly indicates the effectiveness of the indium gallium phosphide (InGaP) nucleation layer in the formation of a shallow diffused germanium (Ge) junction.

The solubility of phosphorus (P) is higher than that of arsenic (As), but the diffusion constant of P is lower than that of As. As a result, arsenic (As) diffuses into germanium (Ge) further than phosphorus (P) in lower concentrations. When the indium gallium phosphide (InGaP) nucleation layer is thicker than 350 Å, the n-doping in the germanium (Ge) junction is primarily through the phosphorus (P) diffusion, and the emitter thickness is typically 300 nm with carrier concentration of $\approx5\times10^{19}$ $cm^{-3}$. However, when the thickness of the indium gallium phosphide (InGaP) nucleation layer is less than 350 Å, both the arsenic (As) and the phosphorus (P) are present in the germanium (Ge) and the n-p junction is pushed further into the germanium by arsenic (As) diffusion through the indium gallium phosphide (InGaP) nucleation layer. This two-step diffusion profile may advantageously optimize the current and voltage generated from the germanium (Ge) junction.

As described above, the diffusion of the arsenic (As) and/or the phosphorus (P) into a germanium (Ge) substrate is done primarily by solid phase diffusion. It has been found that a 350 Ålayer of indium gallium phosphide (InGaP) is enough to block the diffusion of arsenic (As) into germanium (Ge). A layer less than 240 Å, however, will allow both the arsenic (As) and phosphorus (P) to diffuse into germanium (Ge). As a result, both arsenic (As) and phosphorus (P) dopants are able to coexist in germanium (Ge). The diffusion of arsenic (As) and phosphorus (P) into germanium (Ge) from the gas phase during the oxide desorption of the germanium (Ge) substrates can be also significant. Thus, the use of a low enough hydride flow rate will minimize the arsenic (As) and phosphorus (P) diffusion into the germanium (Ge) junction.

The composition of the $\text{indium}_x$ $\text{gallium}_{(1-X)}$ phosphide (InGaP) nucleation layer is used, where X can range from 0 to 1. Either indium phosphide (InP) or gallium phosphide (GaP) can be used as the nucleation layer since the thickness can be thin enough to keep the lattice-mismatched layer grown coherently.

Figure 6:
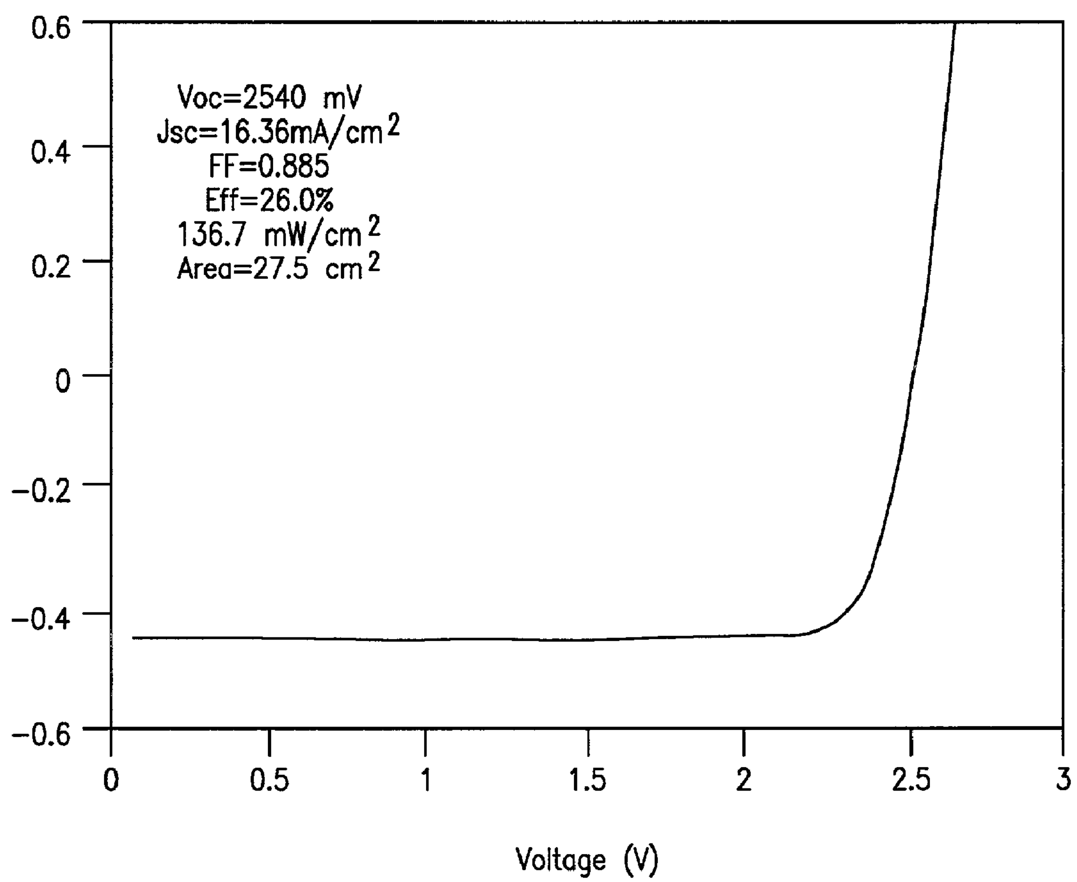
FIG. 6 shows the light current-voltage characteristic of a triple junction solar cell containing an InGaP nucleation layer between the GaAs middle cell and the Ge substrate in accordance with the present invention in FIG. 2.

FIG. 6 shows the light current-voltage characteristic of an triple junction solar cell containing an InGaP nucleation layer between the GaAs middle cell and the Ge substrate in accordance with the present invention in FIG. 2. FIG. 6 shows the data for a 27.5 $cm^2$device subject to 1 sun AM0 illumination incident upon the cell operating at 28° C. In this example the triple junction is current-limited by the top cell so as to provide radiation hardness. In other words this embodiment is that of an end-of-life (EOL) optimized design. A beginning-of-life design can be implemented by simply adjusting the thickness of the top InGaP cell such that its $J_{sc}$ is equal to that of the GaAs middle cell.

While we have described our preferred embodiments of the present invention, it is understood that those skilled in the art, both now and in the future, may make various improvements and enhancements which fall within the scope of the claims which follow. These claims should be construed to maintain the proper protection for the invention first disclosed.

What is claimed is:

1. A solar cell comprising:

a germanium substrate;

a layer of material selected from the group consisting of InP and InGaP disposed directly on the germanium substrate; and a diffused photoactive germanium junction in the substrate.

2. A solar cell as defined in claim 1, wherein the layer of material is InGaP.

3. A solar cell as defined in claim 1, further comprising a top solar subcell formed from InGaP, a middle solar subcell formed from GaAs, and a lower solar subcell formed in the germanium substrate.

4. A solar cell as defined in claim 1, wherein the diffused junction is formed by the diffusion of arsenic into the germanium substrate.

5. A solar cell as defined in claim 1, wherein the layer of material has a lattice parameter substantially equal to the lattice parameter of the germanium substrate.

6. A solar cell as defined in claim 1, wherein the layer has a thickness equal to 350 Angstroms or less.

7. A solar cell defined in claim 1, wherein the cell is capable of photoactively converting radiation ranging from approximately ultraviolet (UV) radiation to radiation having a wavelength of approximately 1800 nm.

8. A solar cell defined in claim 4, wherein the junction in the germanium substrate layer is located between 0.3 μm and 0.7 μm from the top surface of the germanium substrate.

9. A solar cell as defined in claim 1, wherein the diffused germanium substrate forms a first cell layer and has a dopant diffusion profile that optimizes the current and voltage generated therefrom.

10. A solar cell as defined in claim 1, wherein the cell has 1 sun AMO efficiencies in excess of 26%.

11. A solar cell comprising:

a germanium substrate;

a solar subcell layer overlying said substrate and composed of GaAs;

a barrier layer directly overlying and contacting said substrate and underneath said solar subcell layer and functioning to inhibit the diffusion of arsenic into the germanium substrate; and a two step diffusion profile in the germanium substrate with two different dopants.

12. A solar cell as defined in claim 11, further comprising a solar subcell formed in the germanium substrate.

13. A solar cell as defined in claim 12, wherein the subcell formed in the germanium substrate is formed from an n-type germanium layer overlying a p-type germanium substrate.

14. A solar cell as defined in claim 13, wherein the n-type germanium layer is formed by diffusion of arsenic into the germanium substrate.

15. A solar cell a defined in claim 13, wherein the n-type germanium layer is formed by diffusion of phosphorous into the germanium substrate.

16. A solar cell as defined in claim 13, wherein the n-type germanium layer is formed by diffusion of both arsenic and phosphorous into the germanium substrate.

17. A solar cell as defined in claim 11, wherein the barrier layer is composed of InGaP, InP, or GaP.

18. A solar cell as defined in claim 11, wherein the barrier layer has a thickness less than 350 Angstroms.

19. A triple-junction solar cell comprising:

a dual-junction structure comprising a first junction and a second junction;

a third junction having a p-type substrate, wherein the third junction is doped with arsenic (As) and phosphorus (P), wherein the p-type substrate includes first and second diffusion sublayers, wherein P atoms have higher concentration compared to As atoms in the first diffusion sublayer and As atoms have a higher concentration compared to P atoms in the second diffusion sublayer; and a nucleation layer disposed between the dual-junction structure and the third junction and comprising a material that shares a substantially similar lattice parameter with the p-type substrate of the third junction, wherein the nucleation layer serves to control the diffusion of arsenic atoms into the substrate.

20. The triple-junction solar cell as recited in claim 19 wherein the p-type substrate of the third junction is germanium (Ge) and the nucleation layer comprises indium gallium phosphide (InGaP).

21. The triple-junction solar cell as recited in claim 19 wherein the nucleation layer has a thickness substantially equal to 350 Å or less.

22. The triple-junction solar cell as recited in claim 19 wherein the junction depth of the third junction is substantially between 0.3 μm and 0.7 μm.

23. The triple-junction solar cell as recited in claim 19 wherein the third junction comprises a two-step diffusion profile capable of optimizing current and voltage generated from the third junction.

24. The triple-junction solar cell as recited in claim 19 having 1 sun AM0 efficiencies in excess of 26%.

25. The triple-junction solar cell as recited in claim 19 capable of absorbing radiation ranging from approximately ultraviolet (UV) radiation to radiation having a wavelength of approximately 1800 nm.

26. A multi-junction solar cell comprising:

a p-type germanium (Ge) substrate having a first surface, wherein the p-type Ge substrate further includes a diffusion portion having a first diffusion region situated adjacent to the first surface of the p-type Ge substrate and a second diffusion region, which includes a part of the first diffusion region, wherein the second diffusion region diffuses deeper into the Ge substrate than the first diffusion region;

a phosphorus (P) containing nucleation layer disposed over the fist surface of the p-type Ge substrate, wherein the P containing nucleation layer provides n-type P atoms to the first diffusion region; and an arsenic (As) containing buffer layer disposed over the P containing nucleation layer, wherein the As containing buffer layer provides n-type As atoms to the second diffusion region in response to the thickness of the P containing nucleation layer, wherein the second diffusion region has a higher concentration of As atoms than P atoms.

27. The multi-junction solar cell of claim 26, further comprising a second surface situated at the bottom of the multi-junction solar cell.

28. The multi-junction solar cell of claim 26, wherein the first diffusion region has a higher concentration of P atoms than As atoms.

29. A multi-junction solar cell comprising:

a germanium (Ge) substrate having a first diffusion region and a second diffusion region, wherein the second diffusion region diffuses deeper into the Ge substrate than the first diffusion region;

a phosphide nucleation layer disposed over the first surface of the substrate, wherein the phosphide nucleation layer provides diffusion dopants of phosphorus (P) atoms to the first diffusion region; and an arsenide layer disposed over the phosphide nucleation layer, wherein the arsenide layer provides diffusion dopants of arsenic (As) atoms into the second diffusion region in response to the thickness of the phosphide nucleation layer, wherein the first diffusion region has a higher concentration of P atoms than As atoms.

30. The multi-junction solar cell of claim 29, further comprising a second surface situated at the bottom of the multi-junction solar cell.

31. The multi-junction solar cell of claim 29, wherein the second diffusion region has a higher concentration of As atoms than P atoms.

* * * * *